(12) United States Patent
Chan et al.

(10) Patent No.: US 7,453,725 B2
(45) Date of Patent: Nov. 18, 2008

(54) APPARATUS FOR ELIMINATING LEAKAGE CURRENT OF A LOW VT DEVICE IN A COLUMN LATCH

(75) Inventors: Johnny Chan, Fremont, CA (US); Jeffrey Ming-Hung Tsai, San Jose, CA (US); Tin-Wai Wong, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 50 days.

(21) Appl. No.: 11/539,564

(22) Filed: Oct. 6, 2006

(65) Prior Publication Data

US 2008/0084767 A1 Apr. 10, 2008

(51) Int. Cl.
G11C 11/34 (2006.01)
G11C 14/00 (2006.01)
G11C 11/00 (2006.01)
G11C 7/10 (2006.01)

(52) U.S. Cl. .............. 365/185.08; 365/154; 365/189.05
(58) Field of Classification Search ................. 365/154, 365/155, 189.05, 185.08
See application file for complete search history.

(56) References Cited

U.S. PATENT DOCUMENTS

| 5,963,054 | A | 10/1999 | Cochran et al. |
|---|---|---|---|
| 6,414,518 | B1 | 7/2002 | Patel et al. |
| 6,594,185 | B1 * | 7/2003 | Takagi .................... 365/189.15 |
| 6,903,977 | B2 | 6/2005 | Fujiwara et al. |
| 6,972,234 | B1 | 12/2005 | Madurawe et al. |
| 7,280,429 | B2 * | 10/2007 | Kang et al. .............. 365/210.1 |
| 2002/0021587 | A1 * | 2/2002 | Sakui et al. ............ 365/189.05 |
| 2007/0279990 | A1 * | 12/2007 | Choy .................... 365/185.21 |

* cited by examiner

*Primary Examiner*—Ly D Pham
(74) *Attorney, Agent, or Firm*—Schwegman, Lundberg & Woessner, P.A.

(57) ABSTRACT

An improved CMOS high-voltage latch that stores data bits to be written to memory cells of a non-volatile memory is connected to a Vdd supply voltage during a standby mode of operation and during a load-data mode of operation. During a high-voltage write mode of operation, the HV terminal is connected to a HIGH-VOLTAGE supply voltage. A cross-coupled high-voltage CMOS latch is connected between the HV terminal and a ground terminal and has a latch input node B and a latch output node A. An input buffer is connected between the HV terminal and the ground terminal and has an input terminal connected to a DATA INPUT terminal. An output terminal of the input buffer is connected to the latch input node B. The input buffer is enabled during a load-data mode of operation to load data from a DATA INPUT terminal to the latch input node B of the cross-coupled high-voltage CMOS latch.

30 Claims, 6 Drawing Sheets

Fig._3 (Prior Art)

APPARATUS FOR ELIMINATING LEAKAGE CURRENT OF A LOW VT DEVICE IN A COLUMN LATCH

TECHNICAL FIELD

The present invention relates to high-voltage data latches that are used for writing data into non-volatile memories and, more particularly, to apparatus for limiting leakage current drawn from a high voltage supply or generator, such as an on-chip charge pump circuit that provides a high voltage to the high-voltage data latches during a high-voltage write mode of operation.

BACKGROUND ART

A latch is used to store data bits to be written into preselected memory cells of a non-volatile memory. Except when data bits are being written into the memory cells, the latch is normally supplied with a low-voltage power supply, such as, for example, 3 volts or less. During a write mode of operation, the latch is supplied with a high voltage of 7-15 volts, as required for writing data into the non-volatile memory cells. A single non-volatile memory chip may contain a large number, for example, 512 or more, of high-voltage latch circuits. These latch circuits are typically called high-voltage latch circuits, although a high voltage supply is only required for write operations. An on-chip high-voltage supply or generator, such as a charge pump circuit, provides the high-voltage for writing the data bits into the non-volatile memory cells. The high-voltage generator typically has limited current capability and excessive leakage currents in some of the high-voltage latches may load down the generator so much as to cause the high-voltage level to be less than what is required for proper writing of data bits into the memory cells of the non-volatile memory.

FIG. 1 illustrates a typical cross-coupled high-voltage latch circuit 10 that includes a first CMOS inverter circuit 12 and a second CMOS inverter circuit 14. The first CMOS inverter circuit 12 includes a first pull-up PMOS transistor 16 that has a source connected to a HV node 18 and a drain connected to a latch input node A. The first CMOS inverter circuit 12 also includes a first pull-down NMOS transistor 20 that has a drain connected to the latch input node A and a source connected to ground. The gates of the first pull-up PMOS transistor 16 and the pull-down NMOS transistor 20 are connected together. Note that the HV node 18 is supplied with low voltage except when a write mode of operation occurs.

The second CMOS inverter circuit 14 includes a second pull-up PMOS transistor 22 that has a source connected to the HV node 18 and a drain connected to a data storage output node B. The second CMOS inverter circuit 14 also includes a second pull-down NMOS transistor 24 that has a drain connected to the data storage output terminal B and a source connected to ground. The gates of the second pull-up PMOS transistor 22 and the second pull-down NMOS transistor 24 are connected together.

To enable operation of the high-voltage latch circuit 10 with a normal low Vdd voltage being supplied at the HV node 18, the second pull-down NMOS transistor 24 is a low-threshold voltage Vt, high-voltage NMOS transistor, which tends to have a high leakage current at high write voltages because of its susceptibility to punch through at high voltages. Thus, a leakage path is provided from the HV node 18 to ground though a leaky second pull-down NMOS transistor 24 with a low threshold voltage, Vt.

A reset NMOS transistor 32 is connected between the latch input node A and ground. A HIGH RESET signal is applied to a RESET terminal 34 to turn on the reset NMOS transistor 32 and pull the latch input node A to ground.

The latch input node A is connected through a load input NMOS transistor 26 to a DATA In terminal 28. A LOAD signal is provided at a gate terminal 30 of the load input NMOS transistor 26 to load a data bit at the DATA IN terminal 28 into the latch input node A.

An OUTPUT terminal 36 provides the signal from the latch input node A that is provided to write to the memory.

When the non-volatile chip is not being used in a high-voltage write mode of operation, a Vdd logic-circuit power supply voltage of 3 volts, for example, is provided to the HV node 18 to power the two inverters 12, 14 forming the high-voltage latch 10. When the non-volatile chip is actually being used in a high-voltage write mode of operation, a suitable high-voltage power supply of, for example, 7-15 volts is provided to the HV node 18 to power the two inverters 12, 14 forming the high-voltage latch. The high-voltage is supplied from a high-voltage generation circuit, such as, for example, a charge-pump circuit that is provided on the chip.

In order to provide for proper switching operation of the latch with a low Vdd logic-circuit supply voltage, such as, for example, 3 volts or less, the NMOS transistor 24 is a high-voltage, low Vt threshold device. A low VT threshold device is required because it is difficult to load a HIGH or "1" level to the latch because of the Vt voltage drop across the load input NMOS transistor 26 that makes it difficult to load a HIGH or "1" level into the latch input node A.

When the chip is in a high-voltage write mode of operation with the HV terminal 18 at 7-15 volts and when the data storage output node B is at a HIGH, "1", logic level, the high-voltage pull-up PMOS transistor 22 is turned on and the high-voltage pull-down, low-threshold voltage NMOS transistor 24 is turned off. This essentially places almost all of the 7-15 volts from the HV terminal 18 across the low-threshold NMOS transistor 24. If the high-voltage pull-down NMOS transistor 24 is leaky because of the presence of a punch through path in it, a leakage patch goes from the high voltage at the data storage output node B to ground through the leaky pull-down low-threshold NMOS transistor 24.

A non-volatile memory chip has 512 or more high-voltage latches like the typical high-voltage latch circuit 10, some or all of which may be leaky with a high voltage at their HV voltage supply terminals. Excessive leakage currents taken from the on-chip high voltage generation circuit, such as, for example, an on-chip charge pump, that supplies a nominal 15 volts, may cause the voltage at the HV terminal 18 to be pulled down to, say, 12 volts. The reduced high voltage at the HV terminal 18 may cause malfunctions in a memory write function.

FIG. 2 is a timing diagram that illustrates operation of the typical high-voltage latch circuit 10 of FIG. 1, when the DATA IN signal at the DATA IN terminal 28 is LOW, or at 0 volts. A LOAD signal is initially at a LOW level at the gate terminal 30 of the NMOS load input transistor 26 to keep the NMOS load input NMOS transistor 26 off. Initially, the RESET signal at terminal 34 is HIGH, which turns on the reset NMOS transistor 32 to pull the latch input node A to ground. The HV_ ENABLE signal is initially LOW, which provides a Vdd voltage at terminal 18. When the LOAD signal is raised HIGH to Vdd, the NMOS load input NMOS transistor 26 is turned on to provide a LOW logic level DATA IN signal to the latch input node A and the voltage on the data storage output node B goes HIGH to Vdd. Subsequently, the HV_ENABLE control signal goes high to apply a high voltage HV from a high voltage generation circuit to the HV node 18. The second pull-up PMOS transistor 22 is turned on so that the voltage at the data storage output node B is at essentially the same high voltage as at the HV node 18. The HV voltage at the HV node 18 is initially at a Vdd level. However, after the HV_ENABLE control voltage goes HIGH to connect the high voltage generation circuit to the HV node 18, the HV voltage at node 18 rises to a HV(Actual) level that is less than the full HV(Target) level because of the extra leakage current that the high voltage generation circuit must provide to the leaky pull-down NMOS transistor 24 for a number of such high-voltage latch circuits. The full HV(Target) level is, for example, 15 volts while the HV(Actual) level is, for example, 12 volts due to leakage in various high voltage latch circuits. The voltage at the latch input node A and the OUTPUT terminal 36 remains at a LOW state. The voltage at the data storage node B tracks the HV voltage and only rises to the HV(Actual) level.

FIG. 3 is a timing diagram that illustrates operation of the typical high-voltage latch circuit 10 of FIG. 1, when the DATA IN signal at the DATA IN terminal 28 is HIGH. The LOAD signal is initially at a LOW level at the gate terminal 30 of the NMOS load input transistor 26 to keep the NMOS load input transistor 26 off. Initially, the RESET signal at terminal 34 is HIGH, which turns on the reset NMOS transistor 32 to pull the latch input node A to ground. The HV_ENABLE signal is initially LOW, which provides a Vdd voltage at terminal 18. When the LOAD signal is raised to Vdd, the load input NMOS transistor 26 is turned on to provide a HIGH logic level DATA IN signal to the latch input node A and the voltage on the data storage output node B goes low to 0 volts when the pull-up PMOS transistor 22 is turned off and the pull-down NMOS transistor 24 is turned on. Subsequently, the HV_ENABLE control signal goes high to apply the high voltage HV from a high voltage generation circuit to the HV node 18. The first pull-up PMOS transistor 16 is turned on so that the voltage at the data storage output node B is LOW. The HV voltage at the HV node 18 is initially at the Vdd voltage level. After the HV_ENABLE control voltage goes high to connect the high voltage generation circuit to the HV node 18, the HV voltage at node 18 rises to the full HV(Target) level because there is no leakage current through the pull-down NMOS transistor 24. The signal at latch input node A and the OUTPUT terminal 36 tracks the HV level at the HV terminal 18.

Various possible remedies for reducing the effect of leakage through the pull-down NMOS transistor 24, when the voltage at the data storage output terminal B is at a high-voltage level, have some disadvantages. Changing the process parameters for fabrication of the pull-down NMOS transistor 24 may reduce leakage, but this can cause its threshold voltage Vt to increase and adversely affect low-voltage operation.

To decrease leakage current, the resistance of the pull-down NMOS transistor 24 can be increased by increasing the gate length L of the pull-down NMOS transistor, but this takes more area on the chip and increases the size of the chip. The current output, or strength, of the HV generation circuit can be increased; but this may require a larger pump circuit, which takes more area on the chip and increases the size of the chip. Increasing the strength of the HV generation circuit may also require a high clock frequency to provide a greater write current.

In addition to having leakage current, the typical cross-coupled high-voltage latch circuit 10 has other disadvantages. For low voltage operation, the input signal Vdd-Vt needs to overcome the ground voltage at node A. The inverters for this latch must be sized to avoid contention between the voltage levels for control of the input terminal. To avoid losses for input bitline signals, high voltage devices with low Vt are required not only for loading information into the high voltage latch but also for programming and erasing of the memory itself. Leakage is severe for erase and program operations when a LOW signal is loaded in and a HIGH voltage at the data storage output node B causes leakage through the pull-down NMOS transistor 24. Having larger page sizes makes the current leakage even more severe.

SUMMARY OF THE INVENTION

The present invention provides a high-voltage latch system that includes a HV terminal that is coupled to a Vdd supply voltage during a standby mode of operation and during a load-data mode of operation. During a high-voltage write mode of operation, the HV terminal is coupled to a HIGH-VOLTAGE supply voltage.

A cross-coupled high-voltage CMOS latch is coupled between the HV terminal and a ground terminal. The cross-coupled high-voltage CMOS latch has a latch input node B and a latch output node A.

An input BUFFER is coupled between the HV terminal and the ground terminal and has an input terminal coupled to a DATA INPUT terminal. An output terminal of the input BUFFER is coupled to the latch input node B. A data loading means of the input BUFFER is enabled during a load-data mode of operation to load data from the DATA INPUT terminal to the latch input node B of the cross-coupled high-voltage CMOS latch during a load-data mode of operation.

One embodiment of the input buffer is an inverter that includes a pull-up branch and a pull-down branch. The pull-up branch includes a first PMOS pull-up transistor and a second PMOS pull-up transistor coupled in series between the HV terminal and the latch input node B of the cross-coupled high-voltage CMOS latch. The pull-down branch includes a first NMOS pull-down transistor and a second NMOS pull-down transistor coupled in series between the latch input node B of the cross-coupled high-voltage CMOS latch and the ground terminal. A DATA INPUT terminal of the inverter is coupled to a gate of the first PMOS pull-up transistor and a gate of the second NMOS pull-down transistor. A HV LOAD terminal of the inverter is coupled to a gate terminal of the second PMOS pull-up transistor at which is provided a LOADHVB signal. A LOAD terminal of the inverter is coupled to a gate of the second NMOS pull-down transistor at which is provided a LOAD signal.

In a further embodiment, the high-voltage latch system includes a reset NMOS transistor that is coupled between the latch output node A and the ground terminal and that has a gate coupled to a RESET terminal to which is applied a RESET signal.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1:
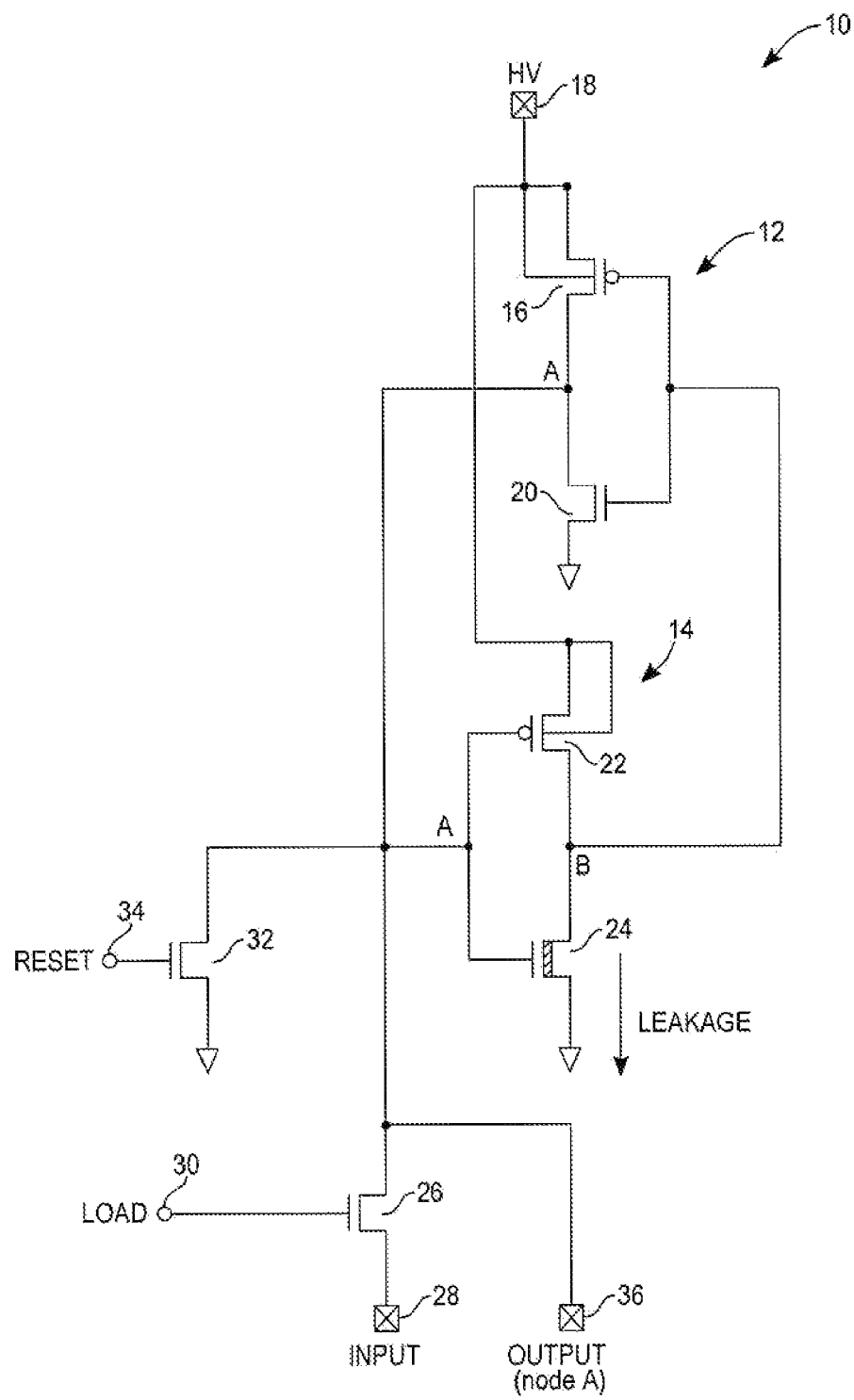
FIG. 1 is a circuit diagram of a prior art high voltage latch circuit having a high-voltage leakage path from an output terminal to ground.
Figure 2:
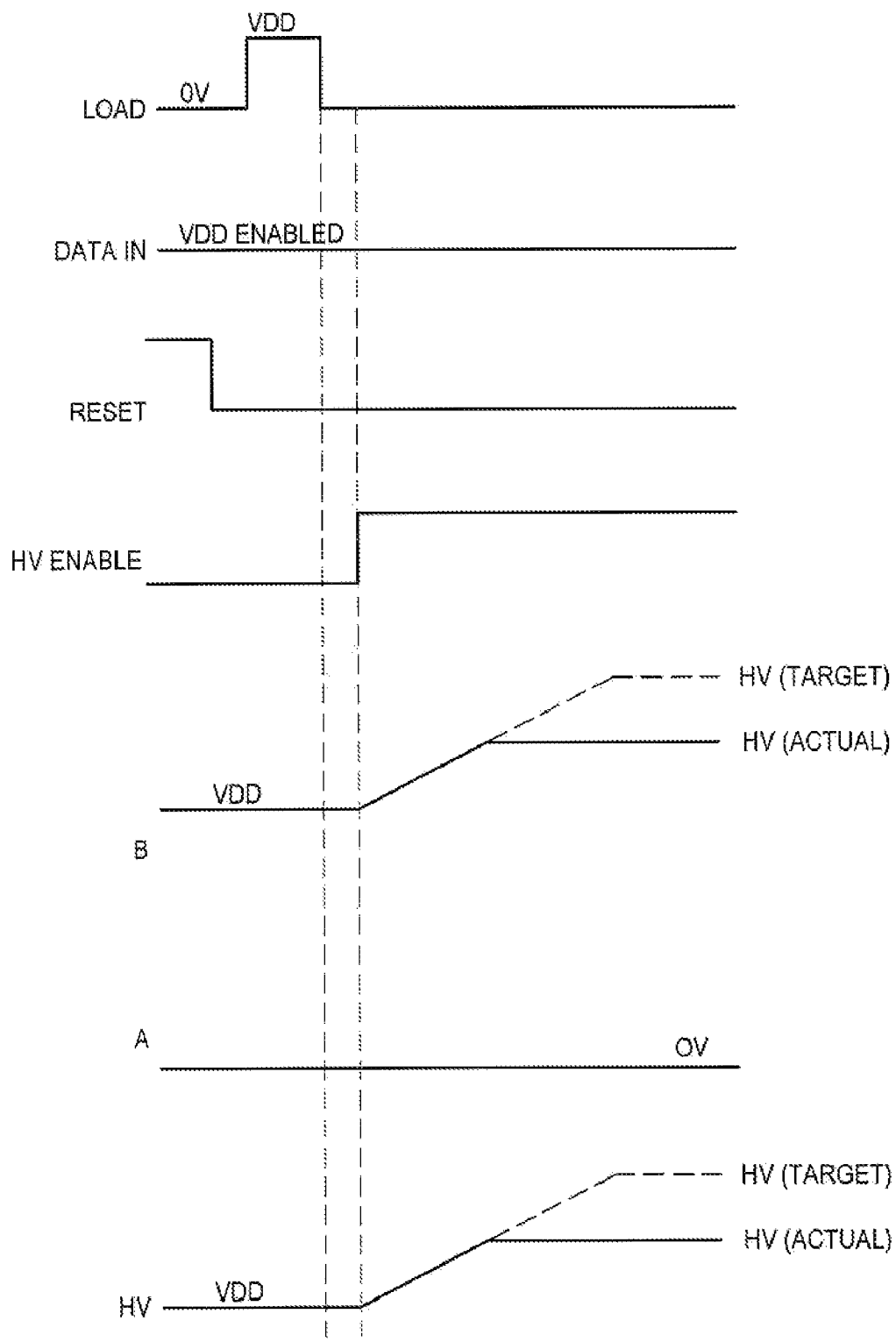
FIG. 2 is a timing diagram for the circuit of FIG. 1 that is loaded with a LOW DATA IN signal.
Figure 3:
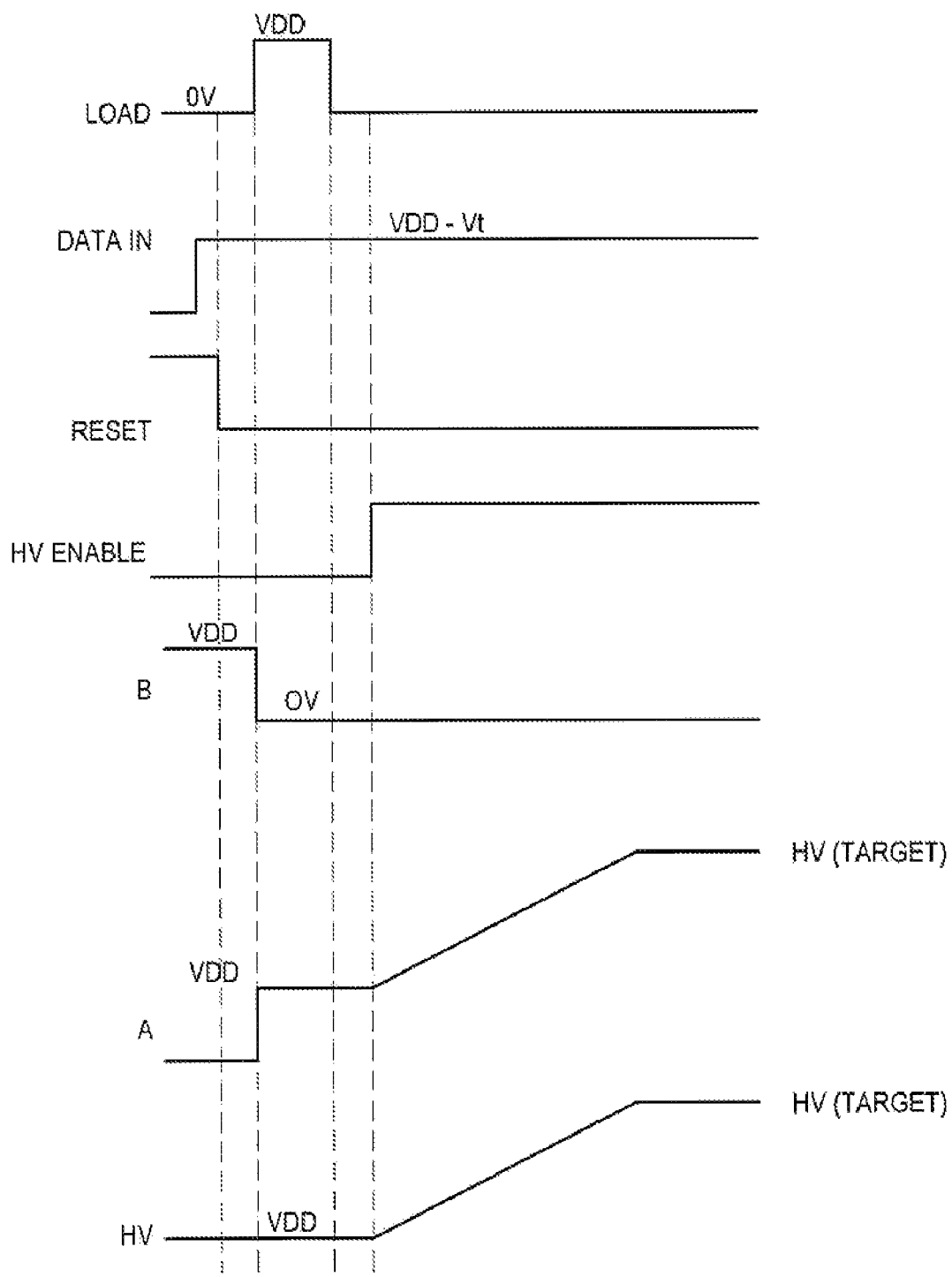
FIG. 3 is a timing diagram for the circuit of FIG. 1 that is loaded with a HIGH DATA IN signal.
Figure 4:
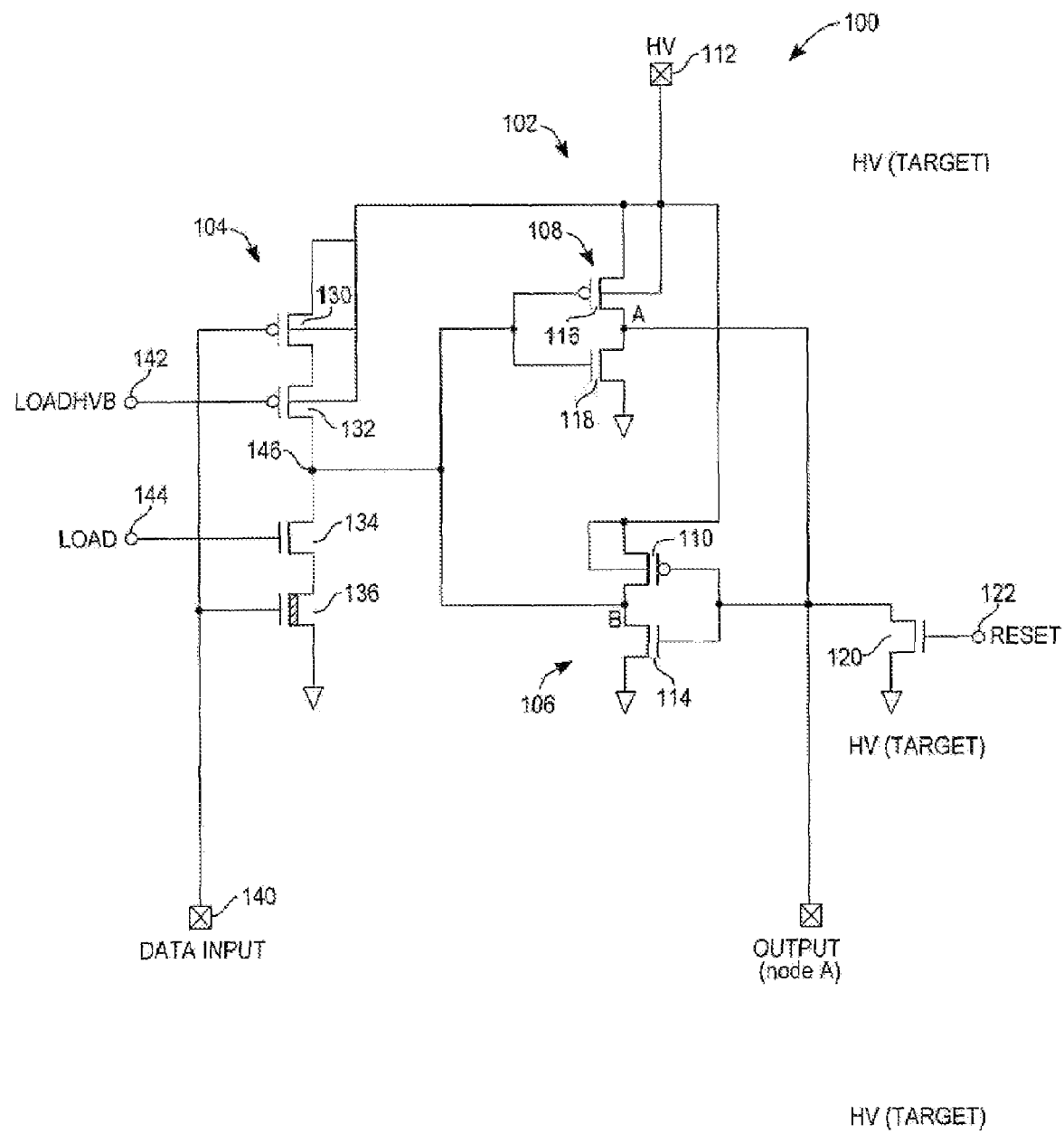
FIG. 4 is a circuit diagram of a high voltage latch circuit according to the present invention.

FIG. 4 illustrates a high-voltage latch system 100 according to the present invention. The latch system 100 includes a high-voltage latch 102 and a buffer circuit 104.

The latch circuit 102 includes a first CMOS inverter circuit 106 and a second CMOS inverter circuit 108. The first CMOS inverter circuit 106 includes a first pull-up PMOS transistor 110 that has a source coupled to a HV node 112 and a drain coupled to a latch input node B. The first CMOS inverter circuit 106 also includes a first pull-down NMOS transistor 114 that has a drain coupled to the latch input node B and a source coupled to ground. The gates of the first pull-up PMOS transistor 110 and the first pull-down NMOS transistor 114 are coupled together.

The second CMOS inverter circuit 108 includes a second pull-up PMOS transistor 116 that has a source coupled to the HV node 112 and a drain coupled to a data storage output node A. The second CMOS inverter circuit 108 includes a second high-voltage NMOS pull-down transistor 118 that has a source terminal coupled to the ground terminal.

The output node A is coupled to the gate terminals of the PMOS transistor 110 and the NMOS transistor 114. The input node B is coupled to the gate terminals of the PMOS transistor 116 and the NMOS transistor 118.

A reset NMOS transistor 120 is coupled between the latch input node B and the ground terminal. A gate terminal of the reset NMOS transistor 120 is coupled to a RESET terminal 122, at which is provided a HIGH RESET signal to turn on the reset NMOS transistor 122 during a standby mode of operation. A LOW RESET signal turns off the reset NMOS transistor 120 during a data-loading mode of operation and during a high-voltage write mode of operation.

The HV terminal 112 is coupled to a Vdd supply voltage during a standby mode of operation and during a load-data mode of operation. The HV terminal 112 is coupled to a HIGH-VOLTAGE supply voltage during a high-voltage write mode of operation.

The buffer circuit 104 is a CMOS inverter circuit that is coupled between the HV terminal 112 and the ground terminal. The buffer circuit 104 includes a first PMOS pull-up transistor 130 and a second PMOS pull-up terminal 112 and the latch input node B of the cross-coupled high-voltage CMOS latch 102. The buffer circuit 104 also includes a first NMOS pull-down transistor 134 and a second NMOS pull-down transistor 136 coupled in series between the latch input node B of the cross-coupled high-voltage CMOS latch 102 and the ground terminal.

A DATA INPUT terminal 140 is coupled to a gate of the first PMOS pull-up transistor 130 and to a gate of the second NMOS pull-down transistor 136. A HV LOAD terminal 142 is coupled to a gate terminal of the second PMOS pull-up transistor 132 at which is provided a LOADHVB signal. A LOAD terminal 144 is coupled to a gate of the first NMOS pull-down transistor 134 at which is provided a LOAD signal. An output terminal 146 of the buffer 104 is coupled to the latch input node B.

The second PMOS pull-up transistor 132 and the second NMOS pull-down transistor 136 provide data loading means for enabling the buffer 104 to load data from the DATA INPUT terminal 140 to the latch input node B of the cross-coupled high-voltage CMOS latch 102 during a load-data mode of operation.

Figure 5:
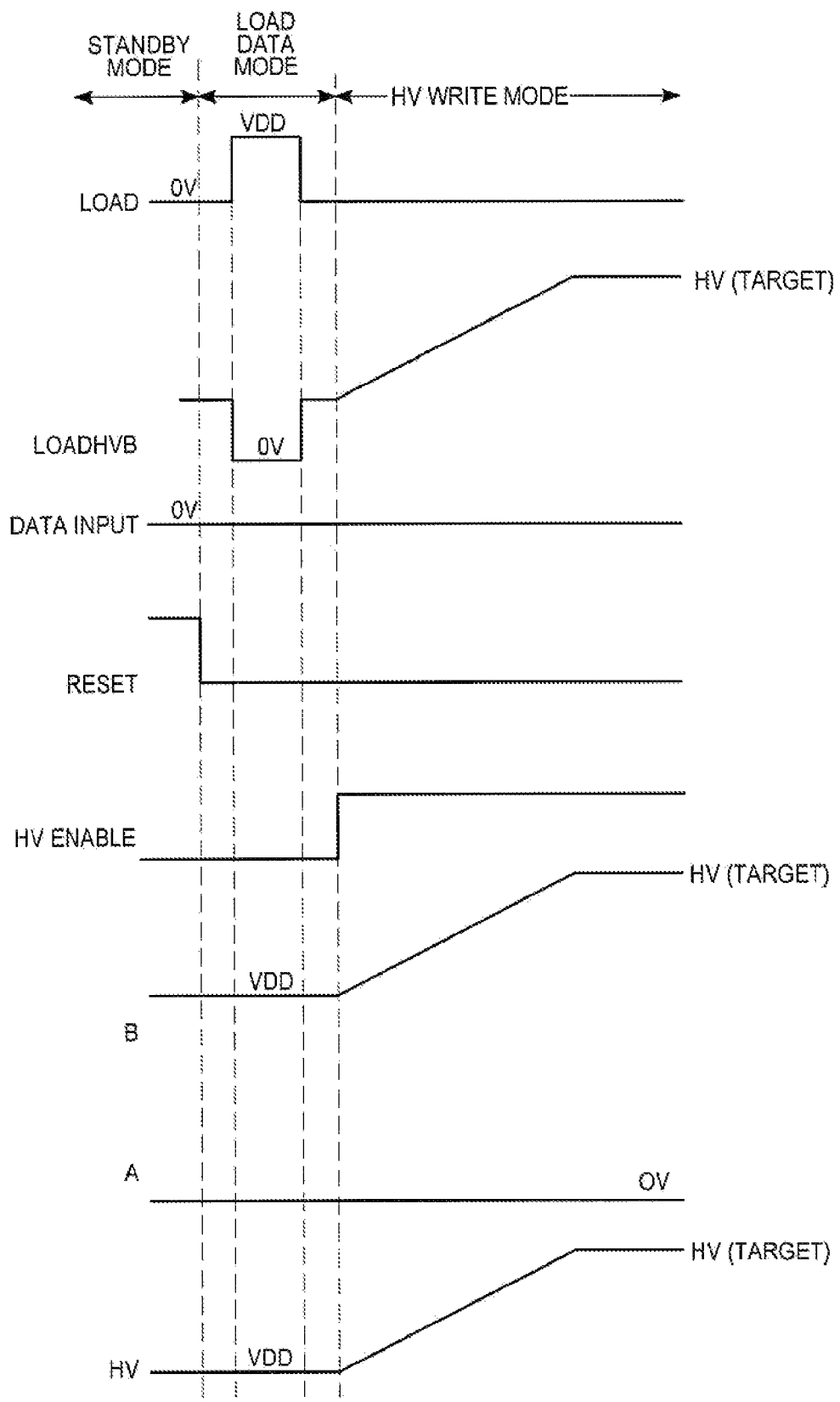
FIG. 5 is a timing diagram for the circuit of FIG. 4 that is loaded with a LOW DATA IN signal.

FIG. 5 is a timing diagram that illustrates operation of the improved high-voltage latch circuit 100 for a LOW DATA IN signal at the DATA INPUT terminal 140. The high-voltage latch circuit 100 operates in three modes: a standby mode, a data-load mode, and a high-voltage write mode. The standby mode of operation occurs when the latch circuit 100 is powered by a low Vdd voltage on the HV node 108. The data-loading mode of operation occurs when the input data signal at the DATA INPUT terminal 140 is loaded into the latch circuit 100 that is still operated with the low Vdd voltage at terminal 108. The high-voltage write mode of operation occurs when the high voltage is applied to the HV node 108 to write data into the non-volatile memory cells.

At the end of the standby mode of operation, the RESET signal at terminal 122 goes low to turn off the reset NMOS transistor 120 to allow the OUTPUT node A to be controlled by the high voltage latch circuit 102.

During the data loading mode of operation with a LOW signal at the DATA INPUT terminal 140, the LOAD signal at terminal 144 goes HIGH to forward bias the NMOS pull-down transistor 134. The LOADHVB signal of terminal 142 goes LOW to forward bias the PMOS pull-up transistor 132. The LOW signal of the DATA INPUT terminal 140 turns on the PMOS pull-up transistor 130 to provide a HIGH level at the latch input node B and a LOW level at the latch output node A.

During the high-voltage write mode of operation with a LOW signal of the DATA INPUT terminal 140, FIG. 5 shows that the HV enable signal goes HIGH and a high voltage supply is applied to the HV node 112. The voltages at HV node 112 and node B begin to ramp up toward the HV (TARGET) level, for example, 15 volts.

Figure 6:
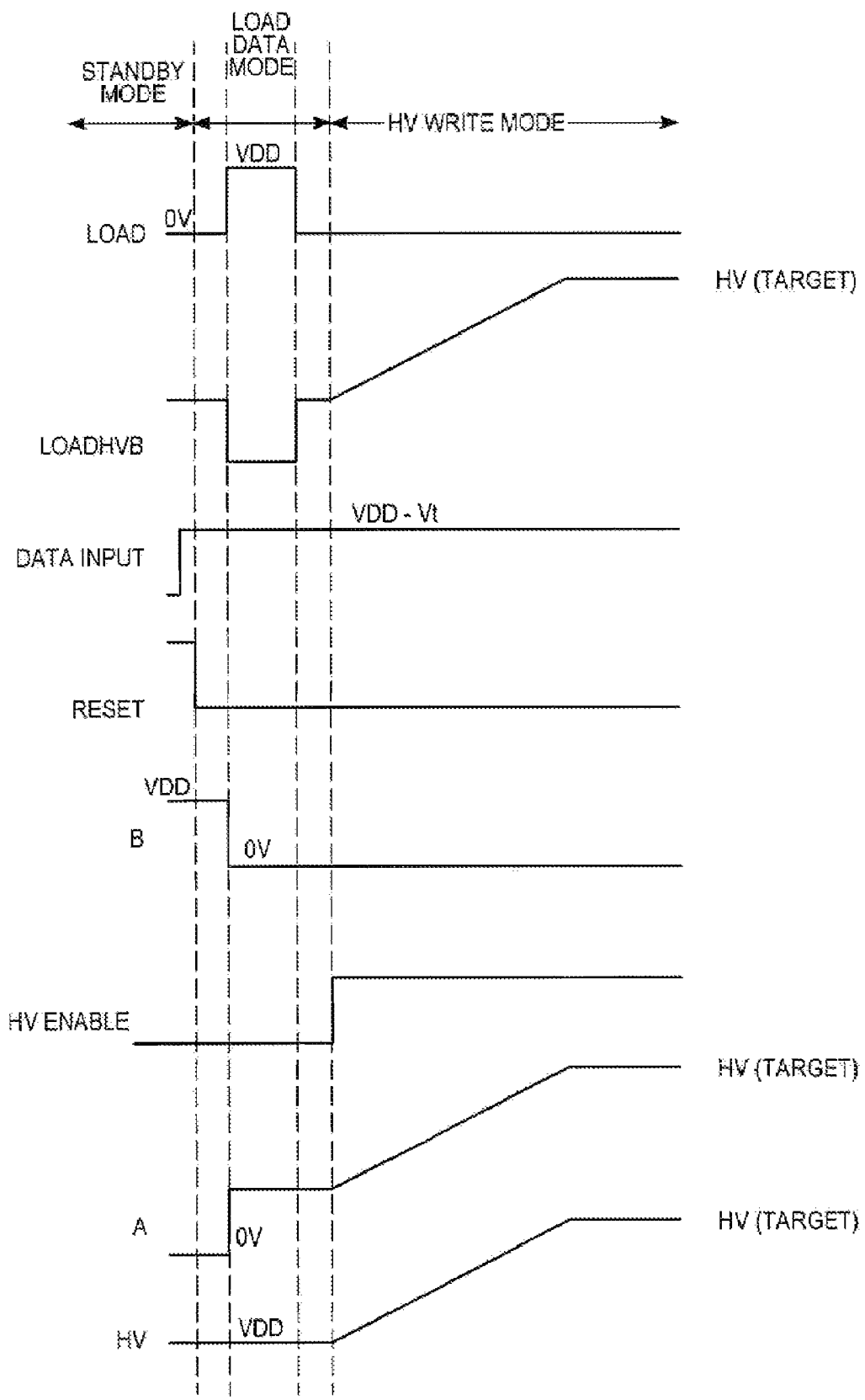
FIG. 6 is a timing diagram for the circuit of FIG. 4 that is loaded with a HIGH DATA IN signal.

FIG. 6 is a timing diagram that illustrates operation of the improved high-voltage latch circuit 100 for a HIGH DATA IN signal at the DATA INPUT input terminal 140.

As previously mentioned, at the end of the standby mode of operation, the RESET signal at terminal 122 goes LOW to turn off the reset NMOS transistor 120 to allow the OUTPUT node A to be controlled by the high-voltage latch circuit 102.

During the data loading mode of operation with a HIGH DATA IN signal at the DATA INPUT terminal 140, the LOAD signal goes HIGH to forward bias the NMOS pull-down transistor 134. The HIGH DATA IN signal at DATA INPUT terminal 140 reverse biases the pull-up transistor 130. This provides a LOW signal at latch input terminal B and a HIGH signal at latch output node A.

During the high-voltage write mode of operation with a HIGH signal at DATA INPUT terminal 140, the HV enable signal goes HIGH to apply a high voltage to the HV terminal 112. The voltages at the HV terminal 112 and at node A begin to ramp up toward the HV (TARGET) level as shown in FIG. 6.

In the present invention, an input bit line is isolated from the high-voltage latch circuit, and the pull-down transistor 136 is not exposed to high voltage, so that no leakage occurs during the high voltage mode of operation. Contention is greatly reduced between the voltage levels for control of the input terminal of the inverters. The latch input node B of the cross-coupled high-voltage CMOS latch can be easily pulled to ground using the buffer pull down circuitry. Because the signal at node B is large enough, sizing of the high-voltage latch can be relaxed and the circuit layout can be smaller. Therefore a high-voltage low Vt NMOS pull-down transistor is not needed in the latch circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A high-voltage latch system for a non-volatile memory, comprising:
   a HV terminal that is coupled to a Vdd supply voltage during a standby mode of operation and during a load-data mode of operation and that is coupled to a HIGH-VOLTAGE supply voltage during a high-voltage write mode of operation;
   a cross-coupled high-voltage CMOS latch that is coupled between the HV terminal and a ground terminal and that has a latch input node B and a latch output node A;
   an input buffer that is coupled between the HV terminal and the ground terminal, that has an input terminal coupled to a DATA INPUT terminal that is adapted to be coupled to a bit line of the non-volatile memory, that has an output terminal coupled to the latch input node B, and that has data loading means for enabling the input buffer to load data from the DATA INPUT terminal to the latch input node B of the cross-coupled high-voltage CMOS latch during a load-data mode of operation;
   wherein the input buffer isolates the DATA INPUT terminal from the high-voltage CMOS latch.

2. The high-voltage latch system of claim 1 wherein the input buffer is an inverter circuit that includes:
   a first PMOS pull-up transistor and a second PMOS pull-up transistor coupled in series between the HV terminal and the latch input node B of the cross-coupled high-voltage CMOS latch;
   a first NMOS pull-down transistor and a second NMOS pull-down transistor coupled in series between the latch input node B of the cross-coupled high-voltage CMOS latch and the ground terminal;
   a DATA INPUT terminal coupled to a gate of the first PMOS pull-up transistor and a gate of the second NMOS pull-down transistor;
   a HV LOAD terminal which is coupled to a gate terminal of the second PMOS pull-up transistor and at which is provided a LOADHVB signal;
   a LOAD terminal which is coupled to a gate of the second NMOS pull-down transistor and at which is provided a LOAD signal; and
   wherein a LOW LOADHVB signal and a HIGH Load signal are provided during a load-data mode of operation.

3. The high-voltage latch system of claim 1 including a reset NMOS transistor coupled between the latch output node A and the ground terminal and having a gate coupled to a RESET terminal to which is applied a RESET signal for setting the latch output node A to a LOW state.

4. The high-voltage latch system of claim 2, further comprising a reset NMOS transistor that is coupled between the latch output node and the ground terminal and includes a gate coupled to a reset terminal to which is applied a reset signal to set the latch output node to a known state.

5. A high-voltage latch system for a non-volatile memory, comprising:
   a HV terminal that is coupled to a Vdd supply voltage during a standby mode of operation and during a load-data mode of operation and that is coupled to a HIGH-VOLTAGE supply voltage during a high-voltage write mode of operation;
   a cross-coupled high-voltage CMOS latch having a latch input node B and a latch output node A;
   an input buffer, including:
   a first PMOS pull-up transistor and a second PMOS pull-up transistor coupled in series between the HV terminal and the latch input node B of the cross-coupled high-voltage CMOS latch;
   a first NMOS pull-down transistor and a second NMOS pull-down transistor coupled in series between the latch input node B of the cross-coupled high-voltage CMOS latch and the ground terminal;
   a DATA INPUT terminal coupled to a gate of the first PMOS pull-up transistor and a gate of the second NMOS pull-down transistor;
   a HV LOAD terminal which is coupled to a gate terminal of the second PMOS pull-up transistor and at which is provided a LOW LOADHVB signal to turn on the second PMOS pull-up transistor;
   a LOAD terminal which is coupled to a gate of the second NMOS pull-down transistor and at which is provided a HIGH LOAD signal to turn on the second NMOS pull-down transistor; and
   wherein the LOW LOADHVB signal and the HIGH LOAD signal are provided during a load-data mode of operation;
   wherein the input buffer isolates the DATA INPUT terminal from the high-voltage CMOS latch.

6. The high-voltage latch system of claim 5 wherein the cross-coupled high-voltage CMOS latch includes:
   a first CMOS inverter and a second CMOS inverter, each having respective input and output terminals, and each being coupled between the HV terminal and a ground terminal;
   the input terminal of the second CMOS inverter and the output terminal of the first CMOS inverter are coupled to a latch input node B;
   the input terminal of the first CMOS inverter and the output terminal of the second CMOS output terminal are coupled to a latch output node A;
   said first CMOS inverter having a first PMOS pull-up transistor coupled between the HV terminal and the latch input node B, said first CMOS inverter having a first NMOS pull-down transistor coupled between the latch input node A and the ground terminal;
   said second CMOS inverter having a second PMOS pull-up transistor coupled between the HV terminal and the latch output node A; and
   said second CMOS inverter having a second high-voltage, low-threshold NMOS pull-down transistor that is coupled to the ground terminal.

7. The high-voltage column latch system of claim 5 including a reset NMOS transistor coupled between the latch output node A and the ground terminal and having a gate coupled to a RESET terminal.

8. The high-voltage latch system of claim 5 wherein the first NMOS pull-down transistor of the input buffer comprises a high-voltage, low-threshold NMOS pull-down transistor.

9. A high-voltage column latch system for a non-volatile memory, comprising:

a HV terminal that is coupled to a Vdd supply voltage during a standby mode of operation and during a load-data mode of operation and that is coupled to a HIGH-VOLTAGE supply voltage during a high-voltage write mode of operation;

an input inverter, including:
a first PMOS pull-up transistor and a second PMOS pull-up transistor coupled in series between the HV terminal and the latch input node B of the cross-coupled high-voltage CMOS latch;
a first NMOS pull-down transistor and a second NMOS pull-down transistor coupled in series between the latch input node B of the cross-coupled high-voltage CMOS latch and the ground terminal;
a DATA INPUT terminal coupled to a gate of the first PMOS pull-up transistor and a gate of the second NMOS pull-down transistor;
an HV LOAD terminal which is coupled to a gate terminal of the second PMOS pull-up transistor and at which is provided a LOADHVB signal; and
a LOAD terminal which is coupled to a gate of the first NMOS pull-down transistor and at which is provided a LOAD signal;
wherein a LOW LOADHVB signal and a HIGH LOAD signal are provided during a load-data mode of operation;

a cross-coupled high-voltage CMOS latch, including:
a first CMOS inverter and a second CMOS inverter, each having respective input and output terminals, and each being coupled between the HV terminal and a ground terminal;
the input terminal of the second CMOS inverter and the output terminal of the first CMOS inverter are coupled to a latch input node B;
the input terminal of the first CMOS inverter and the output terminal of the second CMOS output terminal are coupled to a latch output node A;
said first CMOS inverter having a first PMOS pull-up transistor coupled between the HV terminal and the latch input node B, said first CMOS inverter having a first NMOS pull-down transistor coupled between the latch input node A and the ground terminal;
said second CMOS inverter having a second PMOS pull-up transistor coupled between the HV terminal and the latch output node A;
said second CMOS inverter having a second high-voltage, low-threshold NMOS pull-down transistor that is coupled to the ground terminal;
wherein the input buffer isolates the DATA INPUT terminal from the high-voltage CMOS latch.

10. The high-voltage column latch SYSTEM of claim 9 including a reset NMOS transistor coupled between the latch output node A and the ground terminal and having a gate coupled to a RESET terminal.

11. A high-voltage latch system for a non-volatile memory, comprising:
a high-voltage terminal that is coupled to a Vdd supply voltage during a standby mode of operation and during a load-data mode of operation and that is coupled to a high supply voltage during a high-voltage write mode of operation;
a cross-coupled high-voltage CMOS latch that is coupled between the high-voltage terminal and a ground terminal and that has a latch input node and a latch output node;
an input buffer that is coupled between the high-voltage terminal and the ground terminal, the input buffer being coupled to an input terminal that is adapted to be coupled to a bit line of the non-volatile memory, the input buffer including an output terminal coupled to the latch input node and a first transistor coupled to load data from the input terminal to the latch input node of the cross-coupled high-voltage CMOS latch during the load-data mode of operation; and
wherein the input buffer includes a second transistor that is coupled to substantially isolate the input terminal from the cross-coupled high-voltage CMOS latch during the high-voltage write mode of operation.

12. The high-voltage latch system of claim 11 wherein the input buffer is an inverter circuit that includes:
a first PMOS pull-up transistor and a second PMOS pull-up transistor coupled in series between the high-voltage terminal and the latch input node of the cross-coupled high-voltage CMOS latch;
a first NMOS pull-down transistor and a second NMOS pull-down transistor coupled in series between the latch input node of the cross-coupled high-voltage CMOS latch and the ground terminal;
wherein the input terminal is coupled to a gate of the first PMOS pull-up transistor and a gate of the first NMOS pull-down transistor;
a first load terminal that is coupled to a gate terminal of the second PMOS pull-up transistor and is coupled to receive a first load signal;
a second load terminal that is coupled to a gate of the second NMOS pull-down transistor and is coupled to receive a second load signal; and
wherein the first load signal is low and the second load signal is high during the load-data mode of operation.

13. The high-voltage latch system of claim 11, further comprising a reset NMOS transistor that is coupled between the latch output node and the ground terminal and includes a gate coupled to a reset terminal to which is applied a reset signal to set the latch output node to a known state.

14. A high-voltage latch system for a non-volatile memory, comprising:
a high-voltage terminal that is coupled to a Vdd supply voltage during a standby mode of operation and during a load-data mode of operation and that is coupled to a high supply voltage during a high-voltage write mode of operation;
a cross-coupled high-voltage CMOS latch having a latch input node and a latch output node;
an input buffer, including:
a first PMOS pull-up transistor and a second PMOS pull-up transistor coupled in series between the high-voltage terminal and the latch input node of the cross-coupled high-voltage CMOS latch;
a first NMOS pull-down transistor and a second NMOS pull-down transistor coupled in series between the latch input node of the cross-coupled high-voltage CMOS latch and a ground terminal;
an input terminal coupled to a gate of the first PMOS pull-up transistor and a gate of the first NMOS pull-down transistor;
a first load terminal that is coupled to a gate terminal of the second PMOS pull-up transistor and is coupled to receive a first load signal to control the second PMOS pull-up transistor;
a second load terminal that is coupled to a gate of the second NMOS pull-down transistor and is coupled to receive a second load signal to control the second NMOS pull-down transistor; and wherein the first load signal is low and the second load signal is high during the load-data mode of operation; and wherein the input buffer is coupled to substantially isolate the input terminal from the cross-coupled high-voltage CMOS latch during the high-voltage write mode of operation.

15. The high-voltage latch system of claim 14 wherein the cross-coupled high-voltage CMOS latch includes:

a first CMOS inverter and a second CMOS inverter, each having respective input and output terminals, and each being coupled between the high-voltage terminal and the ground terminal;

the input terminal of the second CMOS inverter and the output terminal of the first CMOS inverter are coupled to the latch input node;

the input terminal of the first CMOS inverter and the output terminal of the second CMOS inverter are coupled to the latch output node; and wherein:

said first CMOS inverter includes a first PMOS pull-up transistor coupled between the high-voltage terminal and the latch input node, said first CMOS inverter having a first NMOS pull-down transistor coupled between the latch input node and the ground terminal;

said second CMOS inverter includes a second PMOS pull-up transistor coupled between the high-voltage terminal and the latch output node; and said second CMOS inverter includes a second NMOS pull-down transistor that is coupled to the ground terminal.

16. The high-voltage latch system of claim 14, further comprising a reset NMOS transistor coupled between the latch output node and the ground terminal and including a gate coupled to a reset terminal to set the latch output node to a known state.

17. A high-voltage column latch system for a non-volatile memory, comprising:

a high-voltage terminal that is coupled to a Vdd supply voltage during a standby mode of operation and during a load-data mode of operation and that is coupled to a high supply voltage during a high-voltage write mode of operation;

an input inverter, including:

a first PMOS pull-up transistor and a second PMOS pull-up transistor coupled in series between the high-voltage terminal and a latch input node of a cross-coupled high-voltage CMOS latch;

a first NMOS pull-down transistor and a second NMOS pull-down transistor coupled in series between the latch input node of the cross-coupled high-voltage CMOS latch and a ground terminal;

an input terminal that is coupled to a gate of the first PMOS pull-up transistor and a gate of the first NMOS pull-down transistor;

a first load terminal that is coupled to a gate terminal of the second PMOS pull-up transistor and is coupled to receive a first load signal; and a second load terminal that is coupled to a gate of the second NMOS pull-down transistor and is coupled to receive a second load signal;

wherein the first load signal is low and the second load signal is high during the load-data mode of operation; and the cross-coupled high-voltage CMOS latch includes:

a first CMOS inverter and a second CMOS inverter, each having respective input and output terminals, and each being coupled between the high-voltage terminal and the ground terminal;

the input terminal of the second CMOS inverter and the output terminal of the first CMOS inverter are coupled to the latch input node;

the input terminal of the first CMOS inverter and the output terminal of the second CMOS output terminal are coupled to a latch output node;

said first CMOS inverter includes a first latch PMOS pull-up transistor coupled between the high-voltage terminal and the latch input node, said first CMOS inverter having a first latch NMOS pull-down transistor coupled between the latch input node and the ground terminal;

said second CMOS inverter includes a second latch PMOS pull-up transistor coupled between the high-voltage terminal and the latch output node;

said second CMOS inverter includes a second latch NMOS pull-down transistor that is coupled to the ground terminal;

wherein the input buffer substantially isolates the input terminal from the cross-coupled high-voltage CMOS latch.

18. The high-voltage column latch system of claim 17, further comprising a reset NMOS transistor coupled between the latch output node and the ground terminal and including a gate coupled to a reset terminal to set the latch output node to a known state.

19. An apparatus comprising:

a first terminal that is coupled to a supply voltage during a standby mode of operation and during a load-data mode of operation and that is coupled to a high supply voltage during a high-voltage write mode of operation;

a latch circuit coupled between the first terminal and a reference potential and having a latch input node and a latch output node;

an input buffer circuit coupled between an input terminal and the latch input node, the input buffer including:

a first transistor coupled between the input terminal and the latch input node to load data from the input terminal to the latch input node during the load-data mode of operation; and a second transistor to enable the input buffer circuit to load data from the input terminal to the latch input node during the load-data mode of operation, wherein the second transistor substantially isolates the input terminal from the latch input node during the high-voltage write mode of operation.

20. The apparatus of claim 19, wherein the first transistor includes:

a first PMOS pull-up transistor that is coupled between the first terminal and the latch input node of the latch circuit, the first PMOS pull-up transistor including a gate coupled to receive a signal from the input terminal; and a first NMOS pull-down transistor coupled between the latch input node of the latch circuit and a reference potential, the first NMOS pull-down transistor including a gate coupled to receive a signal from the input terminal, the first PMOS pull-up transistor and the first NMOS pull-down transistor to invert the signal from the input terminal at the latch input node of the latch circuit.

21. The apparatus of claim 20 wherein the first NMOS pull-down transistor comprises a high-voltage, low-threshold NMOS pull-down transistor.

22. The apparatus of claim 19, wherein the second transistor includes:

a second PMOS pull-up transistor that is coupled between the first terminal and the latch input node of the latch circuit, the second PMOS pull-up transistor including a gate coupled to receive a first load signal to switch on the second PMOS pull-up transistor during the load-data mode of operation; and a second NMOS pull-down transistor coupled between the latch input node of the latch circuit and a reference potential, the second NMOS pull-down transistor including a gate coupled to receive a second load signal to switch on the second NMOS pull-down transistor during the load-data mode of operation.

23. The apparatus of claim 19, wherein:
the reference potential is a ground potential;
the input terminal is adapted to be coupled to a bit line of a non-volatile memory to receive a data signal from the bit line; and
the latch circuit is a cross-coupled high-voltage CMOS latch circuit coupled between the first terminal and the reference potential.

24. The apparatus of claim 19, further comprising a reset NMOS transistor that is coupled between the latch output node and the reference potential and includes a gate coupled to a reset terminal to which is applied a reset signal to set the latch output node to a known state.

25. A method comprising:
coupling a supply voltage to a first terminal during a first mode of operation and during a load-data mode of operation of a latch circuit;
switching on an enable transistor in an input buffer circuit coupled to an input terminal to enable the input buffer circuit during the load-data mode of operation;
loading data from the input terminal to a latch input node of the latch circuit through a second transistor in the input buffer circuit during the load-data mode of operation;
coupling a high supply voltage to the first terminal during a high-voltage write mode of operation of the latch circuit; and switching off the enable transistor in the input buffer circuit to substantially isolate the input terminal from the latch circuit during the high-voltage write mode of operation.

26. The method of claim 25 wherein loading data from the input terminal includes:
coupling a signal from the input terminal to a gate of a first PMOS pull-up transistor that is coupled between the first terminal and the latch input node of the latch circuit; and
coupling the signal from the input terminal to a gate of a first NMOS pull-down transistor coupled between the latch input node of the latch circuit and a reference potential.

27. The method of claim 26 wherein switching off the enable transistor includes switching off the enable transistor in the input buffer circuit to substantially isolate the first NMOS pull-down transistor from the latch circuit during the high-voltage write mode of operation.

28. The method of claim 25 wherein:
switching on an enable transistor in an input buffer circuit includes:
switching on a second PMOS pull-up transistor that is coupled between the first terminal and the latch input node of the latch circuit; and
switching on a second NMOS pull-down transistor coupled between the latch input node of the latch circuit and a reference potential; and
switching off the enable transistor includes switching off the second PMOS pull-up transistor and switching off the second NMOS pull-down transistor.

29. The method of claim 25 wherein loading data includes loading data from the input terminal to the latch input node of a cross-coupled high-voltage CMOS latch circuit.

30. The method of claim 25, further comprising setting a latch output node of the latch circuit to a known state by switching on a reset NMOS transistor that is coupled between the latch output node and a reference potential.

* * * * *

UNITED STATES PATENT AND TRADEMARK OFFICE
CERTIFICATE OF CORRECTION

PATENT NO. : 7,453,725 B2
APPLICATION NO. : 11/539564
DATED : November 18, 2008
INVENTOR(S) : Chan et al.

It is certified that error appears in the above-identified patent and that said Letters Patent is hereby corrected as shown below:

On the Title page Item -54-, line 2, delete "VT" and insert -- Vt --, therefor.

In column 1, line 2, delete "VT" and insert -- Vt --, therefor.

In column 1, line 66, delete "though" and insert -- through --, therefor.

In column 2, line 26, delete "VT" and insert -- Vt --, therefor.

In column 2, line 40, delete "patch" and insert -- path --, therefor.

In column 3, line 62, delete "high" and insert -- higher --, therefor.

In column 3, line 67, delete "this" and insert -- the --, therefor.

In column 5, line 49, after "pull-up" insert -- transistor 132 coupled in series between the HV --.

Signed and Sealed this

Twenty-fourth Day of February, 2009

JOHN DOLL
*Acting Director of the United States Patent and Trademark Office*